(12) United States Patent
Ding et al.

(10) Patent No.: US 8,278,746 B2
(45) Date of Patent: Oct. 2, 2012

(54) SEMICONDUCTOR DEVICE PACKAGES INCLUDING CONNECTING ELEMENTS

(75) Inventors: Yi-Chuan Ding, Kaohsiung (TW); Chia-Ching Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 166 days.

(21) Appl. No.: 12/753,837

(22) Filed: Apr. 2, 2010

(65) Prior Publication Data

US 2011/0241192 A1    Oct. 6, 2011

(51) Int. Cl.
*H01L 25/065* (2006.01)
*H01L 23/52* (2006.01)
*H01L 21/70* (2006.01)
*H01L 23/48* (2006.01)

(52) U.S. Cl. ........... 257/686; 257/E23.141; 257/E23.01; 257/E25.013; 257/E21.532; 257/690; 257/723; 257/777; 257/728; 257/773; 257/774

(58) Field of Classification Search .................. 257/686, 257/E23.141, E23.01, E25.013, E21.532, 257/690, 685, 723, 777, 728, 773, 774; 438/109
See application file for complete search history.

(56) References Cited

U.S. PATENT DOCUMENTS

| | | |
|---|---|---|
| 3,959,874 A | 6/1976 | Coucoulas |
| 4,783,695 A | 11/1988 | Eichelberger et al. |
| 5,019,535 A | 5/1991 | Wojnarowski et al. |
| 5,072,289 A | 12/1991 | Sugimoto et al. |
| 5,091,769 A | 2/1992 | Eichelberger |
| 5,111,278 A | 5/1992 | Eichelberger |
| 5,120,678 A | 6/1992 | Moore et al. |
| 5,128,831 A | 7/1992 | Fox, III et al. |
| 5,139,610 A | 8/1992 | Dunaway et al. |
| 5,149,662 A | 9/1992 | Eichelberger |
| 5,151,776 A | 9/1992 | Wojnarowski et al. |
| 5,157,589 A | 10/1992 | Cole, Jr. et al. |
| 5,207,585 A | 5/1993 | Byrnes et al. |
| 5,222,014 A | 6/1993 | Lin |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |

(Continued)

FOREIGN PATENT DOCUMENTS

JP         07335783         12/1995

(Continued)

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".

(Continued)

*Primary Examiner* — A O Williams
(74) *Attorney, Agent, or Firm* — Foley & Lardner, LLP

(57) ABSTRACT

Described herein are wafer-level semiconductor device packages with stacking functionality and related stacked package assemblies and methods. In one embodiment, a semiconductor device package includes a set of connecting elements disposed adjacent to a periphery of a set of stacked semiconductor devices. At least one of the connecting elements is wire-bonded to an active surface of an upper one of the stacked semiconductor devices.

20 Claims, 6 Drawing Sheets

U.S. PATENT DOCUMENTS

| | | |
|---|---|---|
| 5,353,195 A | 10/1994 | Fillion et al. |
| 5,353,498 A | 10/1994 | Fillion et al. |
| 5,355,580 A | 10/1994 | Tsukada |
| 5,397,997 A | 3/1995 | Tuckerman et al. |
| 5,400,948 A | 3/1995 | Sajja et al. |
| 5,422,513 A | 6/1995 | Marcinkiewicz et al. |
| 5,468,681 A | 11/1995 | Pasch |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,567,656 A | 10/1996 | Chun |
| 5,579,207 A | 11/1996 | Hayden et al. |
| 5,594,275 A | 1/1997 | Kwon et al. |
| 5,608,265 A | 3/1997 | Kitano et al. |
| 5,703,400 A | 12/1997 | Wojnarowski et al. |
| 5,710,062 A | 1/1998 | Sawai et al. |
| 5,714,800 A | 2/1998 | Thompson |
| 5,726,493 A | 3/1998 | Yamashita et al. |
| 5,745,984 A | 5/1998 | Cole, Jr. et al. |
| 5,748,452 A | 5/1998 | Londa |
| 5,763,939 A | 6/1998 | Yamashita |
| 5,834,340 A | 11/1998 | Sawai et al. |
| 5,841,193 A | 11/1998 | Eichelberger |
| 5,844,315 A | 12/1998 | Melton et al. |
| 5,861,666 A | 1/1999 | Bellaar |
| 5,866,952 A | 2/1999 | Wojnarowski et al. |
| 5,883,426 A | 3/1999 | Tokuno et al. |
| 5,889,327 A | 3/1999 | Washida |
| 5,889,655 A | 3/1999 | Barrow |
| 5,892,290 A | 4/1999 | Chakravorty et al. |
| 5,929,521 A | 7/1999 | Wark et al. |
| 5,973,393 A | 10/1999 | Chia et al. |
| 5,985,695 A | 11/1999 | Freyman et al. |
| 6,046,071 A | 4/2000 | Sawai et al. |
| 6,072,236 A | 6/2000 | Akram et al. |
| 6,080,932 A | 6/2000 | Smith et al. |
| 6,159,767 A | 12/2000 | Eichelberger et al. |
| 6,177,724 B1 | 1/2001 | Sawai |
| 6,194,250 B1 | 2/2001 | Melton et al. |
| 6,195,268 B1 | 2/2001 | Eide |
| 6,232,151 B1 | 5/2001 | Ozmat et al. |
| 6,239,482 B1 | 5/2001 | Fillion et al. |
| 6,265,765 B1 | 7/2001 | DiStefano et al. |
| 6,294,741 B1 | 9/2001 | Cole, Jr. et al. |
| 6,303,997 B1 | 10/2001 | Lee |
| 6,306,680 B1 | 10/2001 | Fillion et al. |
| 6,358,780 B1 | 3/2002 | Smith et al. |
| 6,377,461 B1 | 4/2002 | Ozmat et al. |
| 6,396,148 B1 | 5/2002 | Eichelberger et al. |
| 6,426,545 B1 | 7/2002 | Eichelberger et al. |
| 6,448,665 B1 | 9/2002 | Nakazawa et al. |
| 6,451,624 B1 | 9/2002 | Farnworth et al. |
| 6,461,881 B1 | 10/2002 | Farnworth et al. |
| 6,486,006 B2 | 11/2002 | Hirano et al. |
| 6,489,676 B2 | 12/2002 | Taniguchi et al. |
| 6,501,165 B1 | 12/2002 | Farnworth et al. |
| 6,513,236 B2 | 2/2003 | Tsukamoto |
| 6,521,995 B1 | 2/2003 | Akram et al. |
| 6,525,413 B1 | 2/2003 | Cloud et al. |
| 6,555,908 B1 | 4/2003 | Eichelberger |
| 6,614,104 B2 | 9/2003 | Farnworth et al. |
| 6,617,687 B2 | 9/2003 | Akram et al. |
| 6,680,529 B2 | 1/2004 | Chen et al. |
| 6,701,614 B2 | 3/2004 | Ding et al. |
| 6,740,546 B2 | 5/2004 | Corisis et al. |
| 6,740,964 B2 | 5/2004 | Sasaki |
| 6,780,746 B2 | 8/2004 | Kinsman et al. |
| 6,787,392 B2 | 9/2004 | Quah |
| 6,798,057 B2 | 9/2004 | Bolkin et al. |
| 6,812,066 B2 | 11/2004 | Taniguchi et al. |
| 6,815,254 B2 | 11/2004 | Mistry et al. |
| 6,818,544 B2 | 11/2004 | Eichelberger et al. |
| 6,828,665 B2 | 12/2004 | Pu et al. |
| 6,838,776 B2 | 1/2005 | Leal et al. |
| 6,845,554 B2 | 1/2005 | Frankowsky et al. |
| 6,847,109 B2 | 1/2005 | Shim |
| 6,861,288 B2 | 3/2005 | Shim et al. |
| 6,888,255 B2 | 5/2005 | Murtuza et al. |
| 6,921,683 B2 | 7/2005 | Nakayama |
| 6,921,975 B2 | 7/2005 | Leal et al. |
| 6,924,550 B2 | 8/2005 | Corisis et al. |
| 6,936,930 B2 | 8/2005 | Wang |
| 6,953,708 B2 | 10/2005 | Hedler et al. |
| 6,974,334 B2 | 12/2005 | Hung |
| 7,002,805 B2 | 2/2006 | Lee |
| 7,015,075 B2 | 3/2006 | Fay et al. |
| 7,015,571 B2 | 3/2006 | Chang et al. |
| 7,026,709 B2 | 4/2006 | Tsai et al. |
| 7,029,953 B2 | 4/2006 | Sasaki |
| 7,034,386 B2 | 4/2006 | Kurita |
| 7,045,908 B2 | 5/2006 | Ohsumi |
| 7,048,450 B2 | 5/2006 | Beer et al. |
| 7,049,692 B2 | 5/2006 | Nishimura et al. |
| 7,061,079 B2 | 6/2006 | Weng et al. |
| 7,071,028 B2 | 7/2006 | Koike et al. |
| 7,087,991 B2 | 8/2006 | Chen et al. |
| 7,091,595 B2 | 8/2006 | Fuergut et al. |
| 7,112,467 B2 | 9/2006 | Eichelberger et al. |
| 7,145,228 B2 | 12/2006 | Yean et al. |
| 7,163,843 B2 | 1/2007 | Kiendl et al. |
| 7,185,426 B1 | 3/2007 | Hiner et al. |
| 7,187,068 B2 | 3/2007 | Suh et al. |
| 7,221,045 B2 | 5/2007 | Park et al. |
| 7,242,081 B1 | 7/2007 | Lee |
| 7,262,080 B2 | 8/2007 | Go et al. |
| 7,279,784 B2 | 10/2007 | Liu |
| 7,279,789 B2 | 10/2007 | Cheng |
| 7,288,835 B2 | 10/2007 | Yim et al. |
| 7,294,791 B2 | 11/2007 | Danoski et al. |
| 7,309,913 B2 | 12/2007 | Shim et al. |
| 7,344,917 B2 | 3/2008 | Gautham |
| 7,345,361 B2 | 3/2008 | Mallik et al. |
| 7,354,800 B2 | 4/2008 | Carson |
| 7,361,987 B2 | 4/2008 | Leal et al. |
| 7,364,944 B2 | 4/2008 | Huang et al. |
| 7,364,945 B2 | 4/2008 | Shim et al. |
| 7,364,948 B2 | 4/2008 | Lai et al. |
| 7,365,427 B2 | 4/2008 | Lu et al. |
| 7,371,617 B2 | 5/2008 | Tsai et al. |
| 7,372,141 B2 | 5/2008 | Karnezos et al. |
| 7,372,151 B1 | 5/2008 | Fan et al. |
| 7,394,663 B2 | 7/2008 | Yamashita et al. |
| 7,408,244 B2 | 8/2008 | Lee et al. |
| 7,417,329 B2 | 8/2008 | Chuang et al. |
| 7,425,464 B2 | 9/2008 | Fay et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,453,148 B2 | 11/2008 | Yang et al. |
| 7,473,629 B2 | 1/2009 | Tai et al. |
| 7,476,563 B2 | 1/2009 | Mangrum et al. |
| 7,482,198 B2 | 1/2009 | Bauer et al. |
| 7,485,970 B2 | 2/2009 | Hsu et al. |
| 7,501,310 B2 | 3/2009 | Yang et al. |
| 7,511,365 B2 | 3/2009 | Wu et al. |
| 7,514,767 B2 | 4/2009 | Yang |
| 7,550,832 B2 | 6/2009 | Weng et al. |
| 7,550,836 B2 | 6/2009 | Chou et al. |
| 7,560,818 B2 | 7/2009 | Tsai |
| 7,575,173 B2 | 8/2009 | Fuergut et al. |
| 7,586,184 B2 | 9/2009 | Hung et al. |
| 7,588,951 B2 | 9/2009 | Mangrum et al. |
| 7,589,408 B2 | 9/2009 | Weng et al. |
| 7,595,226 B2 | 9/2009 | Lytle et al. |
| 7,619,304 B2 | 11/2009 | Bauer et al. |
| 7,619,901 B2 | 11/2009 | Eichelberger et al. |
| 7,622,733 B2 | 11/2009 | Fuergut et al. |
| 7,633,765 B1 | 12/2009 | Scanlon et al. |
| 7,642,133 B2 | 1/2010 | Wu et al. |
| 7,655,501 B2 | 2/2010 | Yang et al. |
| 7,662,667 B2 | 2/2010 | Shen |
| 7,667,318 B2 | 2/2010 | Yang et al. |
| 7,671,457 B1 | 3/2010 | Hiner et al. |
| 7,675,157 B2 | 3/2010 | Liu et al. |
| 7,692,286 B1 | 4/2010 | Huemoeller et al. |

| | | |
|---|---|---|
| 7,714,431 B1 | 5/2010 | Huemoeller et al. |
| 7,719,094 B2 | 5/2010 | Wu et al. |
| 7,723,839 B2 | 5/2010 | Yano et al. |
| 7,728,431 B2 | 6/2010 | Harada et al. |
| 7,732,242 B2 | 6/2010 | Brunnbauer et al. |
| 7,737,539 B2 | 6/2010 | Kwon et al. |
| 7,737,565 B2 | 6/2010 | Coffy |
| 7,741,151 B2 | 6/2010 | Amrine et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,777,351 B1 | 8/2010 | Berry et al. |
| 7,807,512 B2 * | 10/2010 | Lee et al. ............ 438/127 |
| 7,812,434 B2 | 10/2010 | Yang |
| 7,830,004 B2 | 11/2010 | Wu et al. |
| 7,834,464 B2 * | 11/2010 | Meyer et al. ............ 257/777 |
| 7,838,334 B2 | 11/2010 | Yu et al. |
| 7,932,599 B2 | 4/2011 | Kiendl et al. |
| 8,039,303 B2 * | 10/2011 | Shim et al. ............ 438/107 |
| 2003/0090883 A1 | 5/2003 | Asahi et al. |
| 2003/0129272 A1 | 7/2003 | Shen et al. |
| 2004/0012099 A1 | 1/2004 | Nakayama |
| 2004/0106232 A1 | 6/2004 | Sakuyama et al. |
| 2004/0124515 A1 | 7/2004 | Tao et al. |
| 2004/0126927 A1 | 7/2004 | Lin et al. |
| 2004/0191955 A1 | 9/2004 | Joshi et al. |
| 2005/0054187 A1 | 3/2005 | Ding et al. |
| 2005/0117835 A1 | 6/2005 | Nguyen et al. |
| 2005/0121764 A1 | 6/2005 | Mallik |
| 2005/0253244 A1 | 11/2005 | Chang |
| 2006/0035409 A1 | 2/2006 | Suh et al. |
| 2006/0065387 A1 | 3/2006 | Tonapi et al. |
| 2006/0170112 A1 | 8/2006 | Tanaka et al. |
| 2006/0220210 A1 | 10/2006 | Karnezos et al. |
| 2006/0231944 A1 | 10/2006 | Huang et al. |
| 2006/0240595 A1 | 10/2006 | Lee |
| 2006/0244117 A1 | 11/2006 | Karnezos et al. |
| 2007/0029668 A1 | 2/2007 | Lin et al. |
| 2007/0090508 A1 | 4/2007 | Lin et al. |
| 2007/0096311 A1 | 5/2007 | Humpston et al. |
| 2007/0108583 A1 | 5/2007 | Shim et al. |
| 2007/0222054 A1 | 9/2007 | Hembree |
| 2007/0241453 A1 | 10/2007 | Ha et al. |
| 2007/0273049 A1 | 11/2007 | Khan et al. |
| 2007/0290376 A1 | 12/2007 | Zhao et al. |
| 2008/0017968 A1 | 1/2008 | Choi et al. |
| 2008/0073769 A1 | 3/2008 | Wu et al. |
| 2008/0116574 A1 | 5/2008 | Fan |
| 2008/0137314 A1 | 6/2008 | Salama et al. |
| 2008/0230887 A1 | 9/2008 | Sun et al. |
| 2009/0101400 A1 | 4/2009 | Yamakoshi |
| 2009/0102066 A1 | 4/2009 | Lee et al. |
| 2009/0127686 A1 * | 5/2009 | Yang et al. ............ 257/686 |
| 2009/0129037 A1 | 5/2009 | Yoshino |
| 2009/0224391 A1 | 9/2009 | Lin et al. |
| 2009/0236686 A1 | 9/2009 | Shim et al. |
| 2009/0261466 A1 | 10/2009 | Pagaila et al. |
| 2010/0000775 A1 | 1/2010 | Shen et al. |
| 2010/0006330 A1 | 1/2010 | Fu et al. |
| 2010/0006994 A1 | 1/2010 | Shim et al. |
| 2010/0032821 A1 | 2/2010 | Pagaila et al. |
| 2010/0072599 A1 | 3/2010 | Camacho et al. |
| 2010/0072618 A1 | 3/2010 | Camacho et al. |
| 2010/0084759 A1 | 4/2010 | Shen |
| 2010/0171205 A1 | 7/2010 | Chen et al. |
| 2010/0171206 A1 | 7/2010 | Chu et al. |
| 2010/0171207 A1 | 7/2010 | Shen et al. |
| 2010/0214780 A1 * | 8/2010 | Villard ............ 362/249.02 |
| 2010/0224983 A1 | 9/2010 | Huang et al. |
| 2010/0244208 A1 * | 9/2010 | Pagaila et al. ............ 257/659 |
| 2010/0308449 A1 | 12/2010 | Yang et al. |
| 2010/0314746 A1 | 12/2010 | Hsieh et al. |
| 2010/0320585 A1 * | 12/2010 | Jiang et al. ............ 257/686 |
| 2010/0320593 A1 | 12/2010 | Weng et al. |
| 2011/0018118 A1 | 1/2011 | Hsieh et al. |
| 2011/0018124 A1 | 1/2011 | Yang et al. |
| 2011/0049704 A1 | 3/2011 | Sun et al. |
| 2011/0068453 A1 * | 3/2011 | Cho et al. ............ 257/686 |
| 2011/0115060 A1 | 5/2011 | Chiu et al. |
| 2011/0117700 A1 | 5/2011 | Weng et al. |
| 2011/0127654 A1 | 6/2011 | Weng et al. |
| 2011/0140364 A1 * | 6/2011 | Head ............ 277/314 |
| 2011/0156251 A1 | 6/2011 | Chu et al. |
| 2011/0169150 A1 | 7/2011 | Su et al. |
| 2011/0177654 A1 | 7/2011 | Lee et al. |
| 2011/0194265 A1 | 8/2011 | Su et al. |
| 2011/0227220 A1 | 9/2011 | Chen et al. |
| 2011/0241193 A1 | 10/2011 | Ding et al. |
| 2011/0241194 A1 | 10/2011 | Chen et al. |
| 2011/0278741 A1 * | 11/2011 | Chua et al. ............ 257/777 |

FOREIGN PATENT DOCUMENTS

| | | |
|---|---|---|
| JP | 2000294720 | 10/2000 |
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 4/2006 |

OTHER PUBLICATIONS

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

Yoshida et al., A Study on Package Stacking Process for Package-on-Package (PoP) Electronic Components and Tech. Conf. (ECTC), May 2006, San Diego, CA.

Dreiza et al., "High Density PoP (Package-on-Package) and Package Stacking Development" Electronic Components and Technology Conf. (May 2007).

* cited by examiner

SEMICONDUCTOR DEVICE PACKAGES INCLUDING CONNECTING ELEMENTS

FIELD OF THE INVENTION

The invention relates generally to semiconductor device packages. More particularly, the invention relates to wafer-level semiconductor device packages with stacking functionality.

BACKGROUND

Semiconductor devices have become progressively more complex, driven at least in part by the demand for smaller sizes and enhanced functionality. While the benefits of smaller sizes and enhanced functionality are apparent, these characteristics of semiconductor devices also can create problems.

In conventional wafer-level packaging, semiconductor devices within a wafer are packaged prior to singulation of the wafer. As such, conventional wafer-level packaging can be restricted to a fan-in configuration, namely electrical contacts and other components of a resulting semiconductor device package are restricted to an area defined by a periphery of a semiconductor device. Any component disposed outside of the periphery of the semiconductor device typically is not supported and typically is removed upon singulation. The restriction of a fan-in configuration presents challenges as device sizes continue to shrink, while device functionality continues to increase.

In conjunction, electronic products typically have to accommodate a high density of semiconductor devices in a limited space. For example, the space available for processors, memory devices, and other active or passive devices can be rather limited in cell phones, personal digital assistants, laptop computers, and other portable consumer products. Packaging of semiconductor devices within semiconductor device packages can take up additional valuable space within electronic products. As such, there is a strong trend towards increasing a density of semiconductor devices for a given footprint area taken up by a semiconductor device package. Unfortunately, conventional wafer-level packaging can be inadequate with respect to addressing this trend.

It is against this background that a need arose to develop the wafer-level semiconductor device packages and related stacked package assemblies and methods described herein.

SUMMARY

One aspect of the invention relates to wafer-level semiconductor device packages with stacking functionality and related stacked package assemblies. In one embodiment, a semiconductor device package includes: (1) a redistribution unit including an upper surface; (2) a set of stacked semiconductor devices including: (a) a first semiconductor device disposed adjacent to the redistribution unit and including a first active surface that faces the upper surface of the redistribution unit, and (b) a second semiconductor device disposed adjacent to the first semiconductor device and including a second active surface that faces away from the first active surface; (3) a set of connecting elements disposed adjacent to a periphery of the set of stacked semiconductor devices and each extending upwardly from the upper surface of the redistribution unit, the set of connecting elements including: (a) a first connecting element including a first upper end, and (b) a second connecting element including a second upper end that is wire-bonded to the second active surface of the second semiconductor device; and (4) a package body disposed adjacent to the upper surface of the redistribution unit and covering the set of stacked semiconductor devices and the set of connecting elements, the package body including a central upper surface and a peripheral upper surface, the central upper surface of the package body being spaced above the second active surface of the second semiconductor device, the first upper end of the first connecting element being exposed adjacent to the peripheral upper surface of the package body.

Another aspect of the invention relates to manufacturing methods of forming wafer-level semiconductor device packages with stacking functionality. In one embodiment, a manufacturing method includes: (1) providing a first semiconductor device and a second semiconductor device, the first semiconductor device including a first active surface, the second semiconductor device including a second active surface; (2) stacking the first semiconductor device and the second semiconductor device, such that the first active surface and the second active surface face away from one another; (3) applying a first molding material to form a molded structure covering sides of the first semiconductor device and the second semiconductor device, the molded structure including a front surface and an opposite, back surface, the first active surface of the first semiconductor device being at least partially exposed adjacent to the front surface of the molded structure, the second active surface of the second semiconductor device being at least partially exposed adjacent to the back surface of the molded structure; (4) forming a set of through-holes extending between the front surface and the back surface of the molded structure and surrounding the first semiconductor device and the second semiconductor device; (5) applying an electrically conductive material to the set of through-holes to form a set of connecting elements; (6) forming a redistribution unit adjacent to the first active surface of the first semiconductor device and the front surface of the molded structure; (7) electrically connecting, via a set of wires, the second active surface of the second semiconductor device to at least one of the set of connecting elements; and (8) applying a second molding material adjacent to the second active surface of the second semiconductor device and the back surface of the molded structure to form a package body, the package body including a central portion and a peripheral portion, the central portion having a central thickness Hp so as to cover the second active surface of the second semiconductor device and the set of wires, the peripheral portion having a peripheral thickness $H_{P2}$ so as to at least partially expose one end of at least one of the set of connecting elements.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a connecting element can include multiple connecting elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1A:
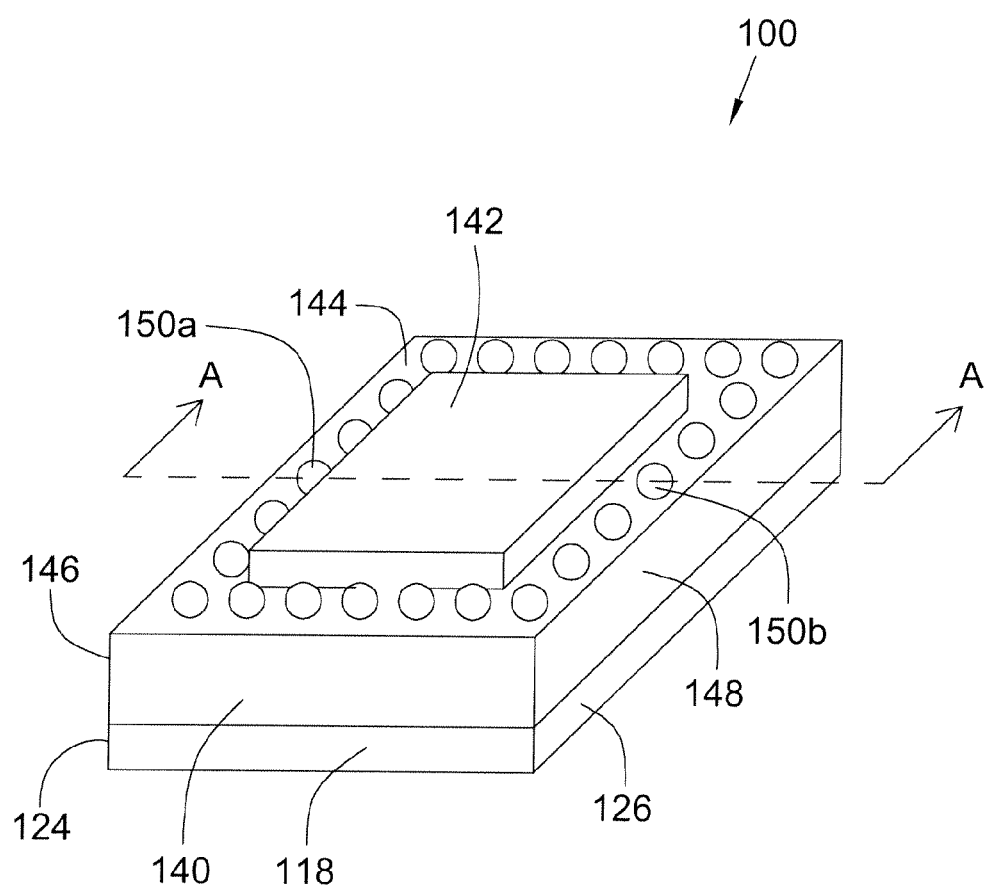
FIG. 1A illustrates a perspective view of a wafer-level semiconductor device package implemented in accordance with an embodiment of the invention.
Figure 1B:
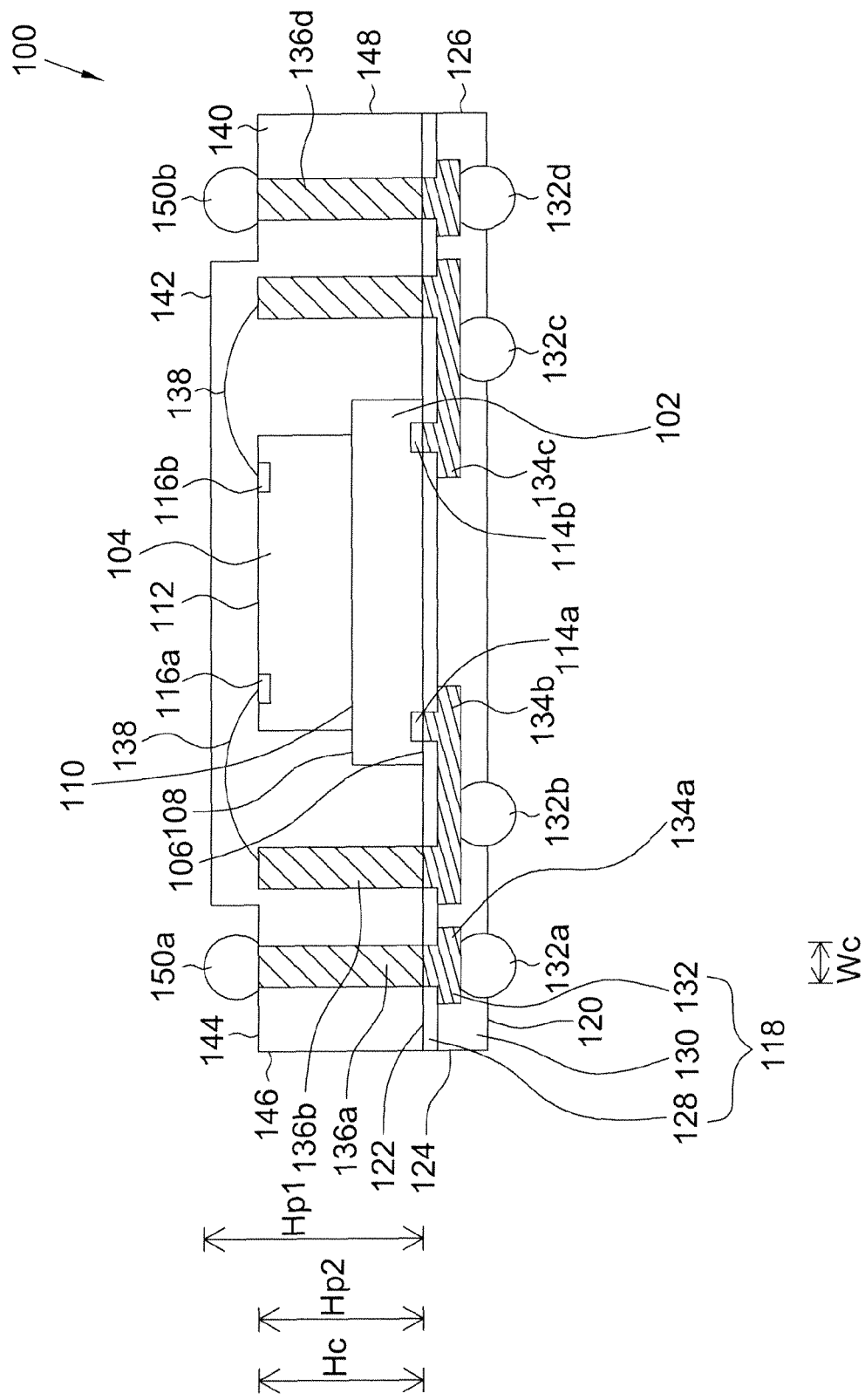
FIG. 1B illustrates a cross-sectional view of the package of FIG. 1A, taken along line A-A of FIG. 1A.

Attention first turns to FIG. 1A and FIG. 1B, which illustrate a wafer-level semiconductor device package 100 implemented in accordance with an embodiment of the invention. In particular, FIG. 1A illustrates a perspective view of the package 100, while FIG. 1B illustrates a cross-sectional view of the package 100, taken along line A-A of FIG. 1A.

Referring to FIG. 1B, the package 100 includes multiple semiconductor devices, namely a semiconductor device 102 and a semiconductor device 104 that is disposed adjacent to the semiconductor device 102. In the illustrated embodiment, the semiconductor devices 102 and 104 are arranged in a stacked configuration within the package 100, and are secured to one another in a suitable fashion, such as using a die attach film or an adhesive. Advantageously, such stacking of the semiconductor devices 102 and 104 within the package 100 achieves a higher density of semiconductor devices for a given footprint area taken up by the package 100. While two semiconductor devices 102 and 104 are illustrated in FIG. 1B, it is contemplated that more or less semiconductor devices can be included for other implementations. In particular, it is contemplated that additional semiconductor devices can be included within the package 100 to achieve an even higher density of semiconductor devices.

As illustrated in FIG. 1B, the semiconductor device 102 includes an upper surface 108, which is a back surface of the semiconductor device 102, and a lower surface 106, which is an active surface of the semiconductor device 102 that has contact pads 114a and 114b disposed adjacent thereto. The semiconductor device 104 includes a lower surface 110, which is a back surface of the semiconductor device 104, and an upper surface 112, which is an active surface of the semiconductor device 104 that has contact pads 116a and 116b disposed adjacent thereto. The contact pads 114a and 114b provide input and output electrical connections for the semiconductor device 102, while the contact pads 116a and 116b provide input and output electrical connections for the semiconductor device 104. In the illustrated embodiment, the semiconductor devices 102 and 104 are stacked in a back-to-back configuration, such that their back surfaces face towards one another, while their active surfaces face away from one another. However, it is contemplated that stacking of the semiconductor devices 102 and 104 can be varied for other implementations. Each of the semiconductor devices 102 and 104 is a semiconductor chip in the illustrated embodiment, although it is contemplated that the semiconductor devices 102 and 104, in general, can be any active devices, any passive devices, or any combination thereof. As illustrated in FIG. 1B, the semiconductor device 102 has a greater lateral extent relative to the semiconductor device 104, although it is contemplated that the semiconductor device 102 can have a smaller lateral extent, or that the semiconductor devices 102 and 104 can have lateral extents that are substantially the same.

Referring to FIG. 1A and FIG. 1B, the package 100 also includes a redistribution unit 118, which is disposed adjacent to the lower surface 106 of the semiconductor device 102. The redistribution unit 118 is electrically connected to the semiconductor devices 102 and 104, and provides electrical pathways as well as mechanical stability and protection against environmental conditions. As illustrated in FIG. 1A and FIG. 1B, the redistribution unit 118 includes a lower surface 120, an upper surface 122, and lateral surfaces 124 and 126 disposed adjacent to a periphery of the redistribution unit 118 and extending between the lower surface 120 and the upper surface 122. In the illustrated embodiment, each of the surfaces 120, 122, 124, and 126 is substantially planar, with the lateral surfaces 124 and 126 having a substantially orthogonal orientation with respect to the lower surface 120 or the upper surface 122, although it is contemplated that the shapes and orientations of the surfaces 120, 122, 124, and 126 can vary for other implementations. The periphery of the redistribution unit 118, as defined by the lateral surfaces 124 and 126, has a greater lateral extent relative to either of the semiconductor devices 102 and 104, thereby allowing the package 100 to be implemented with a fan-out configuration, namely components of the package 100 can be disposed within as well as outside of an area defined by a periphery of the semiconductor device 102 or 104.

In the illustrated embodiment, the redistribution unit 118 is formed in situ during manufacturing as a set of redistribution layers, although it is contemplated that the redistribution unit 118 can include a preformed structure for other implementations. Referring to FIG. 1B, the redistribution unit 118 is multi-layered and includes a pair of dielectric layers 128 and 130 and an electrically conductive layer 132 that is at least partially sandwiched by the dielectric layers 128 and 130. In general, each of the dielectric layers 128 and 130 can be formed from a dielectric material that is polymeric or non-polymeric. For example, at least one of the dielectric layers 128 and 130 can be formed from polyimide, polybenzoxazole, benzocyclobutene, or a combination thereof. The dielectric layers 128 and 130 can be formed from the same dielectric material or different dielectric materials. For certain implementations, at least one of the dielectric layers 128 and 130 can be formed from a dielectric material that is photoimageable or photoactive, thereby reducing manufacturing cost and time by allowing patterning using photolithography. While two dielectric layers 128 and 130 are illustrated in FIG. 1B, it is contemplated that more or less dielectric layers can be included for other implementations.

As illustrated in FIG. 1B, the dielectric layer 128 is formed with one set of openings that are aligned and sized so as to at least partially expose the contact pads 114a and 114b and allow electrical connection to the electrically conductive layer 132, as well as another set of openings that are aligned and sized so as to at least partially expose the electrically conductive layer 132 adjacent to the upper surface 122 of the redistribution unit 118 and outside of the periphery of the semiconductor device 102 or 104. Still referring to FIG. 1B, the dielectric layer 130 is formed with openings that are aligned so as to at least partially expose the electrically conductive layer 132 adjacent to the lower surface 120 of the redistribution unit 118, and that are sized so as to accommodate electrical contacts 132a, 132b, 132c, and 132d. The electrical contacts 132a, 132b, 132c, and 132d provide input and output electrical connections for the package 100, and at least a subset of the electrical contacts 132a, 132b, 132c, and 132d is electrically connected to the semiconductor devices 102 and 104 through the electrically conductive layer 132. In the illustrated embodiment, the electrical contacts 132a, 132b, 132c, and 132d are implemented as solder bumps, and, in accordance with the fan-out configuration of the package 100, the electrical contacts 132a, 132b, 132c, and 132d are laterally disposed outside of the periphery of the semiconductor device 102 or 104, although it is contemplated that the electrical contacts 132a, 132b, 132c, and 132d, in general, can be laterally disposed within that periphery, outside of that periphery, or both. In such manner, the fan-out configuration of the package 100 allows greater flexibility in terms of the arrangement and spacing of the electrical contacts 132a, 132b, 132c, and 132d, with reduced dependence upon the arrangement and spacing of the contact pads 114a and 114b of the semiconductor device 102, as well as reduced dependence upon the arrangement and spacing of the contact pads 116a and 116b of the semiconductor device 104.

The electrically conductive layer 132 serves as a redistribution network for the contact pads 114a and 114b of the semiconductor device 102 and the contact pads 116a and 116b of the semiconductor device 104, and, in accordance with the fan-out configuration of the package 100, the electrically conductive layer 132 extends laterally within the redistribution unit 118 and both within and outside of the periphery of the semiconductor device 102 or 104. As illustrated in FIG. 1B, the electrically conductive layer 132 includes an electrical interconnect 134a, which is electrically connected to the electrical contact 132a and is exposed adjacent to the upper surface 122 of the redistribution unit 118, an electrical interconnect 134b, which electrically connects the contact pads 114a and 116a to the electrical contact 132b and is exposed adjacent to the upper surface 122 of the redistribution unit 118, and an electrical interconnect 134c, which electrically connects the contact pads 114b and 116b to the electrical contacts 132c and 132d and is exposed adjacent to the upper surface 122 of the redistribution unit 118. In general, each of the electrical interconnects 134a, 134b, and 134c can be formed from a metal, a metal alloy, a matrix with a metal or a metal alloy dispersed therein, or another suitable electrically conductive material. For example, at least one of the electrical interconnects 134a, 134b, and 134c can be implemented as a set of vias and a set of electrical traces that are formed from aluminum, copper, titanium, or a combination thereof. The electrical interconnects 134a, 134b, and 134c can be formed from the same electrically conductive material or different electrically conductive materials. While one electrically conductive layer 132 is illustrated in FIG. 1B, it is contemplated that additional electrically conductive layers can be included for other implementations.

As illustrated in FIG. 1B, the package 100 also includes connecting elements 136a, 136b, 136c, and 136d that are disposed outside of the periphery of the semiconductor device 102 or 104. The connecting elements 136a, 136b, 136c, and 136d extend upwardly from the electrically conductive layer 132, and, in particular, the connecting element 136a is electrically connected to and extends upwardly from the electrical interconnect 134a, the connecting element 136b is electrically connected to and extends upwardly from the electrical interconnect 134b, and the connecting elements 136c and 136d are electrically connected to and extend upwardly from the electrical interconnect 134c. Referring to FIG. 1A and FIG. 1B, the connecting elements 136a, 136b, 136c, and 136d are distributed in the form of rows, with each row extending along four sides of a substantially rectangular pattern or a substantially square-shaped pattern. More particularly, the rows include an outer row and an inner row, with the outer row including the connecting elements 136a and 136d, and with the inner row including the connecting elements 136b and 136c. In the illustrated embodiment, connecting elements of the outer row, such as the connecting elements 136a and 136d, provide electrical pathways between the package 100 and another package within a stacked package assembly, and connecting elements of the inner row, such as the connecting elements 136b and 136c, provide electrical pathways within the package 100 and, in particular, between the semiconductor device 104 and other components of the package 100. However, it is contemplated that the provision of inter-package and intra-package electrical pathways also can be combined within one or more of the connecting elements 136a, 136b, 136c, and 136d. By providing electrical pathways that extend vertically, the connecting elements 136a, 136b, 136c, and 136d extend the redistribution network provided by the electrically conductive layer 132 to three dimensions. In such manner, the connecting elements 136a, 136b, 136c, and 136d facilitate stacking of the semiconductor devices 102 and 104 within the package 100 as well as stacking of the package 100 and another package within a stacked package assembly, thereby achieving an even higher density of semiconductor devices for a given footprint area. While two rows of the connecting elements 136a, 136b, 136c, and 136d are illustrated in FIG. 1B, it is contemplated that more or less rows of connecting elements can be included for other implementations, and that the connecting elements 136a, 136b, 136c, and 136d, in general, can be distributed in any one-dimensional pattern or any two-dimensional pattern.

In the illustrated embodiment, the connecting elements 136a, 136b, 136c, and 136d are implemented as elongated structures and, more particularly, as elongated, electrically conductive structures that are disposed within and at least partially fill respective through-holes formed in accordance with manufacturing operations further described below. The connecting elements 136a, 136b, 136c, and 136d are fouled from a metal, a metal alloy, a matrix with a metal or a metal alloy dispersed therein, or another suitable electrically conductive material. For example, at least one of the connecting elements 136a, 136b, 136c, and 136d can be formed from copper or a copper alloy. As illustrated in FIG. 1B, a size of each connecting element 136a, 136b, 136c, or 136d can be specified in accordance with a height $H_C$ of the connecting element 136a, 136b, 136c, or 136d, namely a vertical extent of the connecting element 136a, 136b, 136c, or 136d, and a width $W_C$ of the connecting element 136a, 136b, 136c, or 136d, namely a lateral extent of the connecting element 136a, 136b, 136c, or 136d. If the connecting element 136a, 136b, 136c, or 136d has a non-uniform lateral extent, the width $W_C$ can correspond to, for example, an average of lateral extents along a set of orthogonal directions. For certain implementations, the height $H_C$ of each connecting element 136a, 136b, 136c, or 136d can be in the range of about 100 micrometer ("μm") to about 700 μm, such as from about 150 μm to about 650 μm or from about 200 μm to about 600 μm, and the width $W_C$ of each connecting element 136a, 136b, 136c, or 136d can be in the range of about 100 μm to about 500 μm, such as from about 150 μm to about 450 μm or from about 200 μm to about 400 μm.

Still referring to FIG. 1B, an upper end of each connecting element 136a, 136b, 136c, or 136d is substantially aligned or co-planar with the upper surface 112 of the semiconductor device 104, while a lower end of each connecting element 136a, 136b, 136c, or 136d is substantially aligned or co-planar with the lower surface 106 of the semiconductor device 102. Stated in another way, the height $H_C$ of each connecting element 136a, 136b, 136c, or 136d is substantially the same as combined vertical extents of the semiconductor devices 102 and 104 in their stacked configuration. However, it is contemplated that the vertical extents of the connecting elements 136a, 136b, 136c, and 136d and their alignment with the upper surface 112 and the lower surface 106 can be varied for other implementations. As illustrated in FIG. 1B, the semiconductor device 104 is wire-bonded to the connecting elements 136b and 136c (and other inner row connecting elements) via a set of wires 138, which electrically connect the contact pads 116a and 116b to respective upper ends of the connecting elements 136b and 136c. The wires 138 are formed from gold, copper, or another suitable electrically conductive material. For certain implementations, at least a subset of the wires 138 is desirably formed from copper, since, as compared to gold, copper has a superior electrical conductivity and a lower cost, while allowing the wires 138 to be formed with reduced diameters. The wires 138 can be coated with a suitable metal, such as palladium, as a protection against oxidation and other environmental conditions. Advantageously, the use of wire-bonding facilitates stacking functionality of the package 100, including stacking of the semiconductor devices 102 and 104 within the package 100, without requiring the formation of another redistribution unit to provide electrical pathways, thereby reducing manufacturing cost and time. In addition, the use of wire-bonding can more readily accommodate certain types of semiconductor devices, such as wire-bond chips that are specifically designed for wire-bonding.

Referring to FIG. 1A and FIG. 1B, the package 100 also includes a package body 140 that is disposed adjacent to the upper surface 122 of the redistribution unit 118. In conjunction with the redistribution unit 118, the package body 140 substantially covers or encapsulates the semiconductor devices 102 and 104, the wires 138, and the connecting elements 136b and 136c (and other inner row connecting elements) to provide structural rigidity as well as protection against environmental conditions. In addition, the package body 140 extends to sides of the redistribution unit 118 and covers or encapsulates the connecting elements 136a and 136d (and other outer row connecting elements), while at least partially exposing upper ends of the connecting elements 136a and 136d to allow stacking another package on top of the package 100.

The package body 140 is formed from a molding material, and includes a central upper surface 142, a peripheral upper surface 144, and lateral surfaces 146 and 148, which are disposed adjacent to sides of the package body 140. In the illustrated embodiment, each of the central upper surface 142 and the peripheral upper surface 144 is substantially planar and has a substantially parallel orientation with respect to the lower surface 120 or the upper surface 122 of the redistribution unit 118, although it is contemplated that the shapes and orientations of the upper surfaces 142 and 144 can vary for other implementations. Referring to FIG. 1A and FIG. 1B, the package body 140 has a greater thickness adjacent to a central portion of the package body 140 so as to substantially cover the semiconductor devices 102 and 104, the wires 138, and the connecting elements 136b and 136c, while the package body 140 has a reduced thickness adjacent to a peripheral portion of the package body 140 so as to at least partially expose the connecting elements 136a and 136d, with their upper ends substantially aligned or co-planar with the peripheral upper surface 144. In particular, a central thickness $H_{P1}$ of the package body 140, namely a vertical distance between the central upper surface 142 of the package body 140 and the upper surface 122 of the redistribution unit 118, is greater than a peripheral thickness $H_{P2}$ of the package body 140, namely a vertical distance between the peripheral upper surface 144 of the package body 140 and the upper surface 122 of the redistribution unit 118, which, in turn, is substantially the same as the height $H_C$ of each connecting element 136a, 136b, 136c, or 136d. More particularly, the peripheral thickness $H_{P2}$ can be no greater than about 9/10 of the central thickness $H_{P1}$, such as from about 1/2 to about 9/10 of $H_{P1}$ or from about 2/3 to about 9/10 of $H_{P1}$. For certain implementations, the central thickness $H_{P1}$ can be in the range of about 200 μm to about 800 μm, such as from about 250 μm to about 750 μm or from about 300 μm to about 700 μm, and the peripheral thickness $H_{P2}$ can be in the range of about 100 μm to about 700 μm, such as from about 150 μm to about 650 μm or from about 200 μm to about 600 μm. While upper ends of the connecting elements 136a and 136d are illustrated as substantially aligned with the peripheral upper surface 144, it is also contemplated that the upper ends of the connecting elements 136a and 136d can be recessed below or can protrude above the peripheral upper surface 144.

Referring to FIG. 1A and FIG. 1B, the lateral surfaces 146 and 148 of the package body 140 are substantially planar and have a substantially orthogonal orientation with respect to the lower surface 120 or the upper surface 122 of the redistribution unit 118, although it is contemplated that the shapes and orientations of the lateral surfaces 146 and 148 can vary for other implementations. Also, the lateral surfaces 146 and 148 are substantially aligned or co-planar with the lateral surfaces 124 and 126 of the redistribution unit 118, respectively, such that, in conjunction with the lateral surfaces 124 and 126, the lateral surfaces 146 and 148 define sides of the package 100. More particularly, this alignment is accomplished such that the package body 140 has a lateral extent that substantially corresponds to that of the redistribution unit 118, albeit with a reduced thickness adjacent to the sides of the package 100. For other implementations, it is contemplated that the alignment of the lateral surfaces 124, 126, 146, and 148 can be varied from that illustrated in FIG. 1A and FIG. 1B.

Disposed adjacent to the peripheral upper surface 144 of the package body 140 are electrical contacts, including electrical contacts 150a and 150b, which are electrically connected to and extend upwardly from respective upper ends of the connecting elements 136a and 136d (and other outer row connecting elements). The electrical contacts 150a and 150b serve as pre-solders for stacking another package on top of the package 100, and, like the connecting elements 136a and 136d, the electrical contacts 150a and 150b are distributed in the form of a row extending along four sides of a substantially rectangular pattern or a substantially square-shaped pattern. In the illustrated embodiment, the electrical contacts 150a and 150b are implemented as solder bumps, and, in accordance with the fan-out configuration of the package 100, the electrical contacts 150a and 150b are laterally disposed outside of the periphery of the semiconductor device 102 or 104, although it is contemplated that the electrical contacts 150a and 150b, in general, can be laterally disposed within that periphery, outside of that periphery, or both.

Figure 2A:
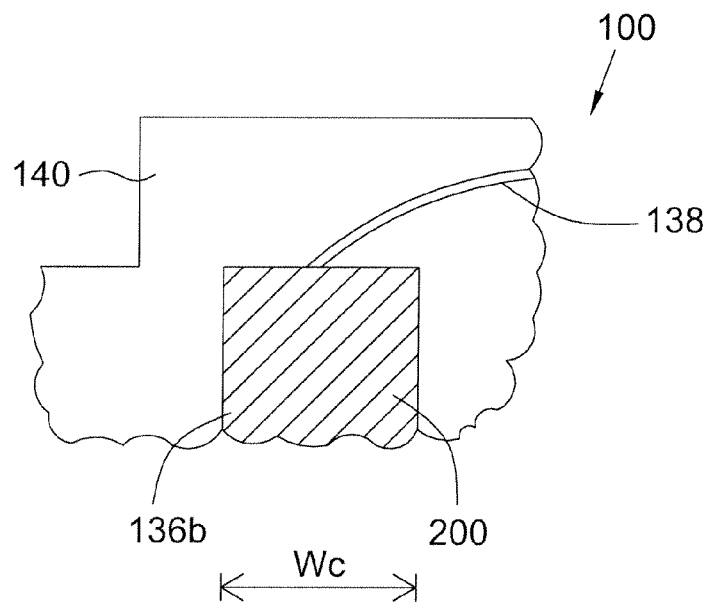
FIG. 2A and FIG. 2B illustrate enlarged, cross-sectional views of a portion of the package of FIG. 1A and FIG. 1B, according to an embodiment of the invention.
Figure 2B:
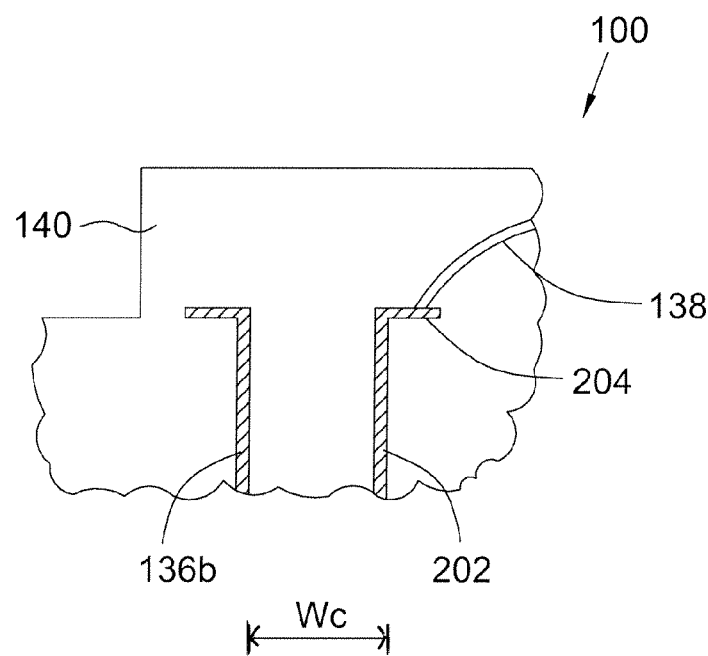

Attention next turns to FIG. 2A and FIG. 2B, which illustrate enlarged, cross-sectional views of a portion of the package 100 of FIG. 1A and FIG. 1B, with certain details omitted for ease of presentation. In particular, FIG. 2A illustrates one particular implementation of the connecting element 136b, while FIG. 2B illustrates another particular implementation of the connecting element 136b. While the following features are described with reference to the connecting element 136b, it is contemplated that these features can similarly apply to other connecting elements of the package 100.

Referring first to FIG. 2A, the connecting element 136b is implemented as a solid, elongated structure and, more particularly, as an electrically conductive pillar or post 200 that is disposed within and substantially fills a through-hole defined by the package body 140. An upper end of the electrically conductive post 200 includes a connection surface to which the wire 138 is electrically connected. During manufacturing, this connection surface can be formed by subjecting the upper end of the electrically conductive post 200 to a set of surface finishing operations, which yield a set of layers to enhance reliability of electrical connections to the wire 138. Examples of surface finishing layers include those based on gold, such as direct immersion gold, electroless nickel/immersion gold, and electroless nickel/electroless palladium/immersion gold.

Turning next to FIG. 2B, the connecting element 136b is implemented as a hollow, elongated structure and, more particularly, as an electrically conductive channel 202 that is disposed within and partially fills a through-hole defined by the package body 140. Referring to FIG. 2B, a molding material forming the package body 140 can fill a remaining portion of the through-hole, although it is contemplated that another suitable filler material can be used, or that the through-hole can remain at least partially hollow. An upper end of the electrically conductive channel 202 has a greater lateral extent and is implemented as a contact pad 204, which includes a connection surface to which the wire 138 is electrically connected. During manufacturing, this connection surface can be formed by subjecting the contact pad 204 to a set of surface finishing operations similar to those described above with reference to FIG. 2A.

Figure 3:
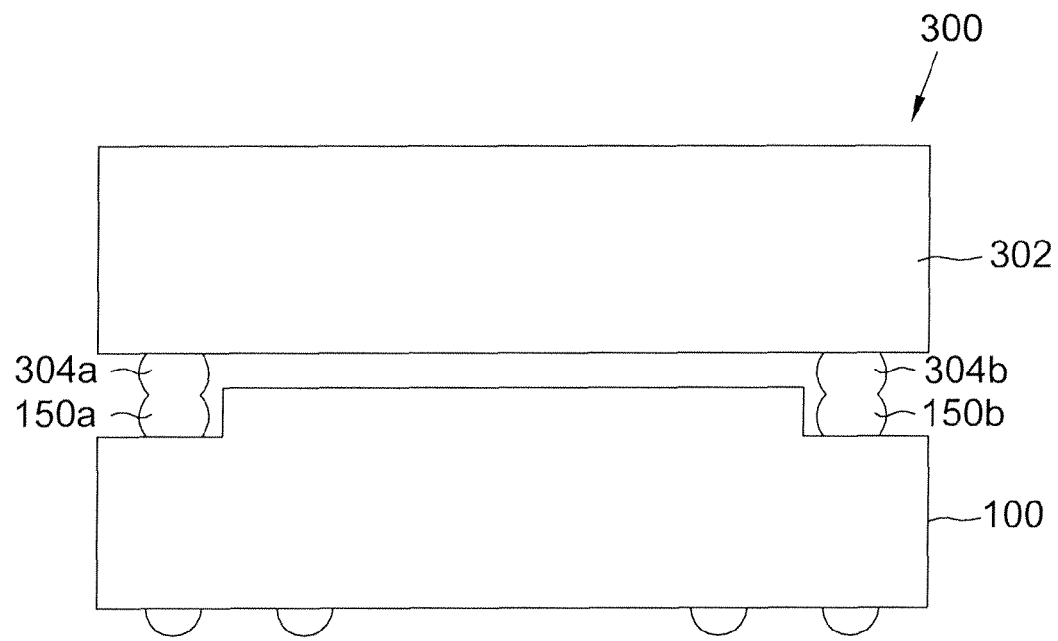
FIG. 3 illustrates a cross-sectional view of a stacked package assembly formed using the package of FIG. 1A and FIG. 1B, according to an embodiment of the invention.

FIG. 3 illustrates a cross-sectional view of a stacked package assembly 300 implemented in accordance with an embodiment of the invention, with certain details omitted for ease of presentation. In particular, FIG. 3 illustrates a particular implementation of the assembly 300 that is formed using the package 100 of FIG. 1A through FIG. 2B.

As illustrated in FIG. 3, the assembly 300 includes a semiconductor device package 302, which corresponds to a top package that is disposed above and electrically connected to the package 100 that corresponds to a bottom package. In the illustrated embodiment, the package 302 is implemented as a ball grid array ("BGA") package, although it is contemplated that a number of other package types can be used, including a land grid array ("LGA") package, a quad flat no-lead ("QFN") package, an advanced QFN ("aQFN") package, and other types of BGA package, such as a window BGA package. While two stacked packages 100 and 302 are illustrated in FIG. 3, it is contemplated that additional packages can be included for other implementations. Certain aspects of the package 302 can be implemented in a similar fashion as previously described for the package 100 and, thus, are not further described herein.

Referring to FIG. 3, the package 302 includes electrical contacts, including electrical contacts 304a and 304b, which provide input and output electrical connections for the package 302 and extend downwardly from a lower surface of the package 302. In the illustrated embodiment, the electrical contacts 304a and 304b are implemented as solder bumps, and, like the electrical contacts 150a and 150b, the electrical contacts 304a and 304b are distributed in the form of a row extending along four sides of a substantially rectangular pattern or a substantially square-shaped pattern. During stacking operations, the electrical contacts 304a and 304b of the package 302 are reflowed and undergo metallurgical bonding with the electrical contacts 150a and 150b of the package 100. In particular, the electrical contacts 304a and 304b fuse or merge with respective ones of the electrical contacts 150a and 150b to provide electrical pathways between the packages 100 and 302.

FIG. 4A through FIG. 4H illustrate a manufacturing method of forming a wafer-level semiconductor device package, according to an embodiment of the invention. For ease of presentation, the following manufacturing operations are described with reference to the package 100 of FIG. 1A through FIG. 2B. However, it is contemplated that the manufacturing operations can be similarly carried out to form other semiconductor device packages.

Figure 4A:
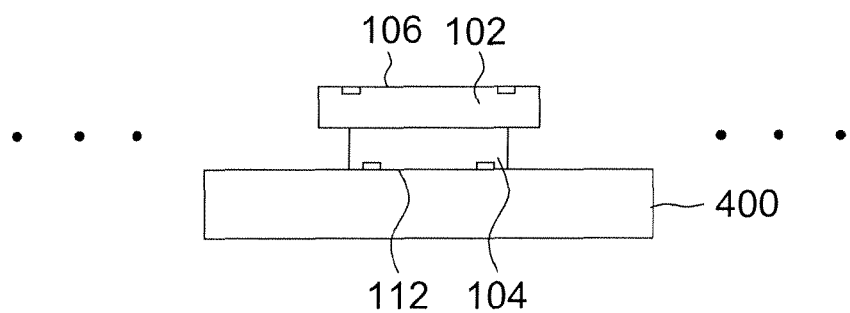
FIG. 4A through FIG. 4H illustrate a manufacturing method of forming the package of FIG. 1A and FIG. 1B, according to an embodiment of the invention.

Referring first to FIG. 4A, a carrier 400 is provided, and multiple pairs of semiconductor devices are disposed adjacent to the carrier 400 in a stacked configuration, including the semiconductor devices 102 and 104. In the illustrated embodiment, the semiconductor devices 102 and 104 are stacked in a back-to-back configuration, with the active surface 112 of the semiconductor device 104 facing the carrier 400, and with the active surface 106 of the semiconductor device 102 facing away from the carrier 400.

Stacked pairs of semiconductor devices can be arranged on the carrier 400 in an array manner, in which the stacked pairs of semiconductor devices are arranged in a two-dimensional fashion, or in a strip manner, in which the stacked pairs of semiconductor devices are arranged sequentially in a linear fashion. The semiconductor device 102 or 104 is initially included within a wafer at an initial spacing with respect to neighboring semiconductor devices, and the wafer is subjected to singulation to separate the semiconductor device 102 or 104 from the neighboring semiconductor devices. In the illustrated embodiment, stacked pairs of semiconductor devices are arranged so as to have a greater nearest-neighbor spacing with respect to one another, relative to an initial nearest-neighbor spacing within a wafer, thereby facilitating a fan-out configuration of resulting packages. For ease of presentation, the following manufacturing operations are primarily described with reference to the semiconductor devices 102 and 104 and related components, although the manufacturing operations can be similarly carried for other stacked pairs of semiconductor devices in a parallel fashion or sequentially.

Figure 4B:
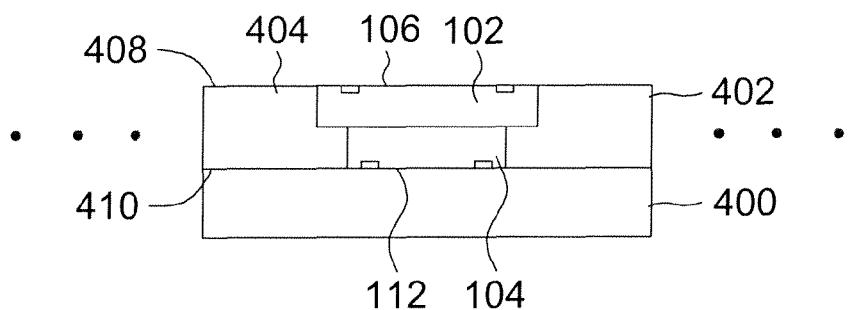

As illustrated in FIG. 4B, a molding material 402 is applied to the carrier 400 so as to cover or encapsulate the semiconductor devices 102 and 104, while the active surfaces 106 and 112 of the semiconductor devices 102 and 104 remain at least partially exposed. Because the semiconductor device 104 is arranged with its active surface 112 facing the carrier 400, sides of the semiconductor device 104 are substantially covered by the molding material 402, while its active surface 112 is substantially uncovered by the molding material 402. Also, by positioning a molding plate or other molding structure adjacent to the active surface 106 of the semiconductor device 102, sides of the semiconductor device 102 are substantially covered by the molding material 402, while its active surface 106 is substantially uncovered by the molding material 402.

The molding material 402 can include, for example, a Novolac-based resin, an epoxy-based resin, a silicone-based resin, or another suitable encapsulant. Suitable fillers also can be included, such as powdered $SiO_2$. The molding material 402 can be applied using any of a number of molding techniques, such as compression molding, injection molding, or transfer molding. Once applied, the molding material 402 is hardened or solidified, such as by lowering the temperature to below a melting point of the molding material 402, thereby forming a molded structure 404. Referring to FIG. 4B, the resulting molded structure 404 includes a front surface 408 that is substantially aligned or co-planar with the active surface 106 of the semiconductor device 102, and an opposite, back surface 410 that is substantially aligned or co-planar with the active surface 112 of the semiconductor device 104. Stated in another way, a thickness of the molded structure 404 is substantially the same as the combined vertical extents of the semiconductor devices 102 and 104 in their stacked configuration. The molded structure 404 along with the encapsulated semiconductor devices 102 and 104 can be referred to as a reconstituted wafer.

Figure 4C:
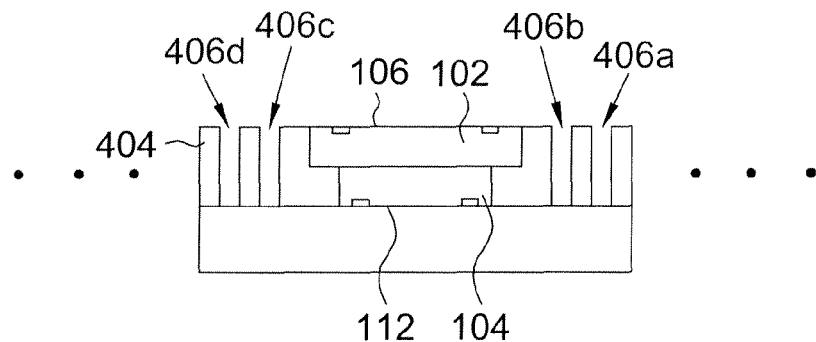

Turning next to FIG. 4C, multiple through-holes are formed in the molded structure 404, including through-holes 406a, 406b, 406c, and 406d that are distributed in the form of an outer row and an inner row surrounding the semiconductor devices 102 and 104, with each row extending along four sides of a substantially rectangular pattern or a substantially square-shaped pattern. The through-holes 406a, 406b, 406c, and 406d can be formed in any of a number of ways, such as chemical etching, laser drilling, or mechanical drilling to form openings. For example, laser drilling can be carried out using a green laser, an infrared laser, a solid-state laser, or a $CO_2$ laser, which applies a laser beam in a pulsed fashion or a continuous wave fashion.

In the illustrated embodiment, each of the through-holes 406a, 406b, 406c, and 406d has a lateral boundary that is shaped in the form of a circular cylinder, including a substantially circular cross-section. However, it is contemplated that the shapes of the through-holes 406a, 406b, 406c, and 406d, in general, can be any of a number of shapes, such as another type of cylindrical shape, such as an elliptic cylindrical shape, a square cylindrical shape, or a rectangular cylindrical shape, or a non-cylindrical shape, such as a cone, a funnel, or another tapered shape. It is also contemplated that the lateral boundaries of the through-holes 406a, 406b, 406c, and 406d can be curved or roughly textured.

Still referring to FIG. 4C, each of the through-holes 406a, 406b, 406c, and 406d vertically extends through substantially the entire thickness of the molded structure 404, namely so as to substantially span a vertical distance between the active surfaces 106 and 112 of the semiconductor devices 102 and 104. However, it is contemplated that the vertical extents of the through-holes 406a, 406b, 406c, and 406d can be varied for other implementations. In the case of laser drilling, suitable selection and control over operating parameters of a laser allow control over sizes and shapes of the through-holes 406a, 406b, 406c, and 406d.

Figure 4D:
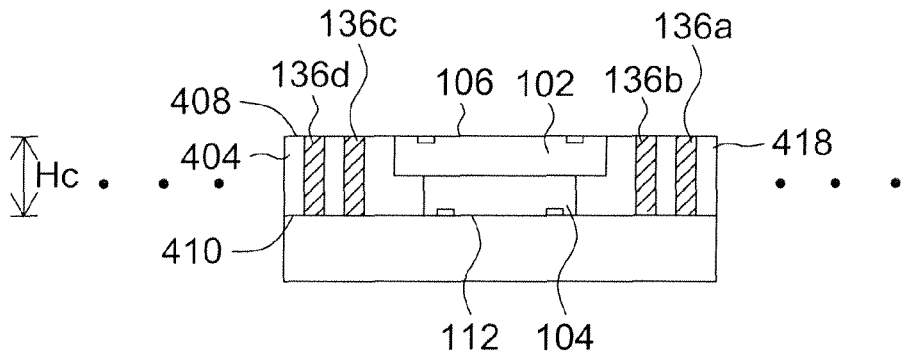

Next, an electrically conductive material 418 is applied to and drawn into the through-holes 406a, 406b, 406c, and 406d so as to at least partially fill the through-holes 406a, 406b, 406c, and 406d, thereby forming the connecting elements 136a, 136b, 136c, and 136d as illustrated in FIG. 4D. The electrically conductive material 418 includes a metal, a metal alloy, a matrix with a metal or a metal alloy dispersed therein, or another suitable electrically conductive material. For example, the electrically conductive material 418 can include a metal, such as copper, a solder, such as any of a number of fusible metal alloys having melting points in the range of about 90° C. to about 450° C., or an electrically conductive adhesive or paste, such as any of a number of resins having an electrically conductive filler dispersed therein. Examples of suitable solders include tin-lead alloys, copper-zinc alloys, copper-silver alloys, tin-silver-copper alloys, bismuth-containing alloys, indium-containing alloys, and antimony-containing alloys, and examples of suitable adhesives include epoxy-based resins and silicone-based resins having silver fillers or carbon fillers. The electrically conductive material 418 can be applied in any of a number of ways, such as electroless plating, electrolytic plating, or by using a dispenser.

Still referring to FIG. 4D, each of the resulting connecting elements 136a, 136b, 136c, and 136d includes one end that is substantially aligned or co-planar with the front surface 408 of the molded structure 404 (and with the active surface 106 of the semiconductor device 102), and an opposite end that is substantially aligned or co-planar with the back surface 410 of the molded structure 404 (and with the active surface 112 of the semiconductor device 104). Stated in another way, the height $H_C$ of each connecting element 136a, 136b, 136c, or 136d is substantially the same as the thickness of the molded structure 404. However, it is contemplated that the vertical extents of the connecting elements 136a, 136b, 136c, and 136d and their alignment with the surfaces 408 and 410 can be varied for other implementations.

Figure 4E:
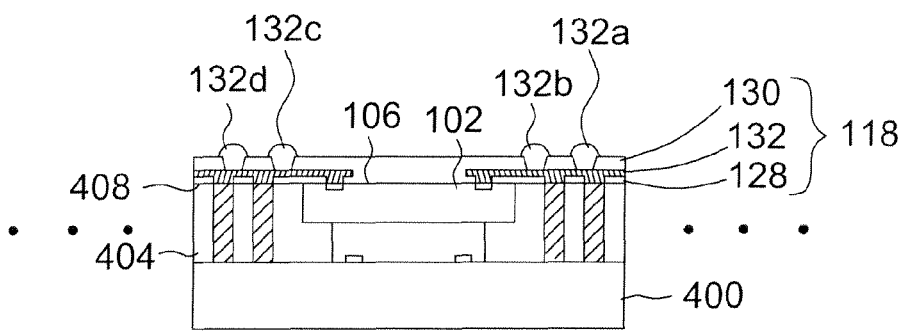

A set of redistribution layers are next formed in situ adjacent to the front surface 408 of the molded structure 404 and the active surface 106 of the semiconductor device 102, thereby forming the redistribution unit 118 as illustrated in FIG. 4E. The redistribution unit 118 includes the pair of dielectric layers 128 and 130 and the electrically conductive layer 132 that is at least partially sandwiched by the dielectric layers 128 and 130. Each of the dielectric layers 128 and 130 is formed by applying a dielectric material using any of a number of coating techniques, such as printing, spinning, or spraying, in conjunction with patterning to form suitably sized and aligned openings. Similarly, an electrically conductive material is applied using any of a number of coating techniques, such as chemical vapor deposition, electroless plating, electrolytic plating, printing, spinning, spraying, sputtering, or vacuum deposition, in conjunction with patterning to form the electrically conductive layer 132. Patterning of the dielectric layers 128 and 130 and the electrically conductive layer 132 can be carried out in any of a number of ways, such as photolithography, chemical etching, laser drilling, or mechanical drilling. Once the redistribution unit 118 is formed, the electrical contacts 132a, 132b, 132c, and 132d are formed and are accommodated by openings defined by the dielectric layer 130, such as by applying a solder and reflowing and solidifying that solder to form solder bumps.

Figure 4F:
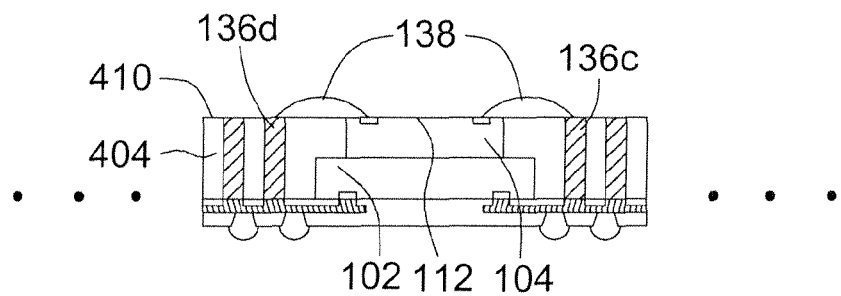

Next, the molded structure 404 along with various encapsulated components are separated from the carrier 400, and are reoriented to an upright orientation as illustrated in FIG. 4F. The semiconductor device 104 is then wire-bonded to the connecting elements 136b and 136c (and other inner row connecting elements) via the wires 138. A set of surface finishing operations can be carried out prior to, or in conjunction with, wire-bonding to enhance reliability of electrical connections. As previously described, the use of wire-bonding provides electrical pathways that allow stacking of the semiconductor devices 102 and 104, without requiring the formation of another redistribution unit adjacent to the back surface 410 of the molded structure 404 and the active surface 112 of the semiconductor device 104.

Figure 4G:
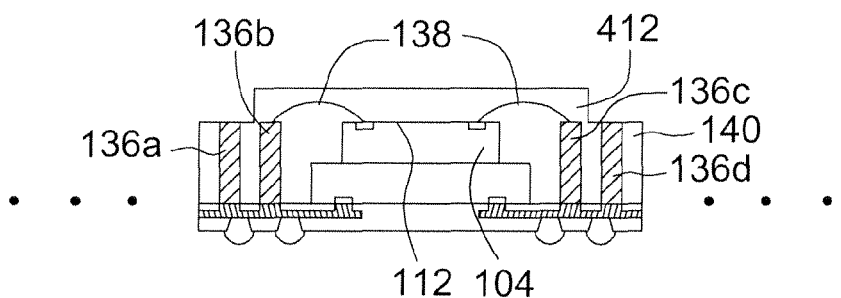

As illustrated in FIG. 4F and FIG. 4G, a molding material 412 is then selectively applied to a central portion of the molded structure 404 so as to substantially cover or encapsulate the active surface 112 of the semiconductor device 104, the wires 138, and upper ends of the connecting elements 136b and 136c (and other inner row connecting elements). The molding material 412 can be the same as, or different from, the molding material 402 previously described with reference to FIG. 4B, and can be applied using any of a number of molding techniques, such as compression molding, injection molding, or transfer molding. Once applied, the molding material 412 is hardened or solidified, such as by lowering the temperature to below a melting point of the molding material 412, thereby forming the package body 140.

Referring to FIG. 4G, the package body 140 has a reduced thickness adjacent to the sides of the package body 140, adjacent to which upper ends of the connecting elements 136a and 136d (and other outer row connecting elements) are exposed. It is also contemplated that the package body 140 can be formed by applying the molding material 412 so as to have a substantially uniform thickness, followed by a thickness-reduction operation, such as chemical etching; laser drilling; mechanical cutting, drilling, routing, or grinding; or another removal technique to yield a varying thickness profile.

Figure 4H:
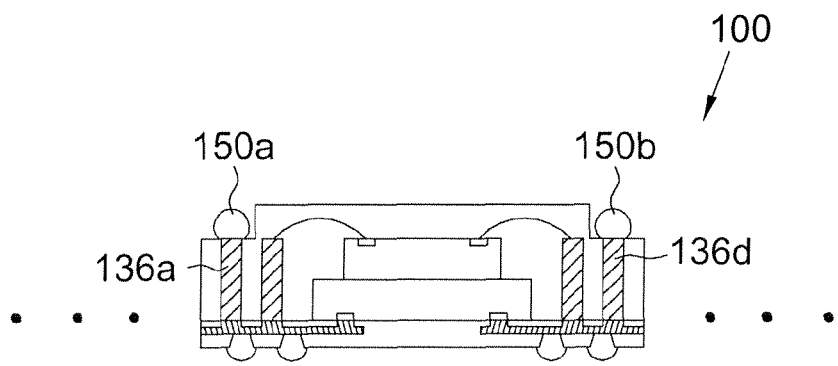

Next, as illustrated in FIG. 4H, the electrical contacts 150a and 150b are formed and are disposed adjacent to upper ends of the connecting elements 136a and 136d, such as by applying a solder and reflowing and solidifying that solder to form solder bumps, thereby resulting in the package 100. Depending upon the particular implementation, a set of singulation operations can be carried out to separate the package 100 from neighboring packages.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
a set of stacked semiconductor devices including:
a first semiconductor device having an active surface and an inactive surface; and
a second semiconductor device coupled to the inactive surface of the first semiconductor device;
a set of connecting elements circumscribing the set of stacked semiconductor devices, the set of connecting elements including:
a first connecting element including an upper end; and
a second connecting element that is electrically connected to the second semiconductor device;
a package body encapsulating the set of stacked semiconductor devices and the second connecting element, the package body having a lower surface that is substantially coplanar with the active surface of the first semiconductor device, wherein the upper end of the first connecting element is substantially exposed from the package body; and
a redistribution layer that is formed over at least a portion of the active surface of the first semiconductor device and at least a portion of the lower surface of the package body, that is electrically connected to the active surface of the first semiconductor device, and that is electrically connected to the first connecting element.

2. The semiconductor package of claim 1, wherein the package body has an upper surface that includes a central portion and a recessed portion circumscribing the central portion.

3. The semiconductor package of claim 2, wherein the upper end of the first connecting element is exposed from the recessed portion.

4. The semiconductor package of claim 2, wherein the second connecting element has an upper end that is substantially coplanar with a substantially horizontal surface of the recessed portion.

5. The semiconductor package of claim 2, wherein the central portion has a thickness greater than a thickness of the recessed portion.

6. The semiconductor package of claim 1, wherein the second connecting element has an upper end that is substantially coplanar with the upper end of the first connecting element.

7. The semiconductor package of claim 1, wherein the second connecting element has an upper end that is substantially coplanar with a surface of the package body.

8. A semiconductor package, comprising:
a redistribution layer;
a first conductive connector and a second conductive connector electrically connected to the redistribution layer;
a molded structure encapsulating the plurality of conductive connectors, wherein:
the first conductive connector extends from the redistribution layer and has an upper surface that is exposed at an upper surface of the molded structure; and
the second conductive connector extends from the redistribution layer and has an upper surface that is encapsulated by the molded structure, and the upper surface of the second conductive connector is substantially coplanar with the upper surface of the first conductive connector.

9. The semiconductor package of claim 8, further comprising:
a first semiconductor device; and
a second semiconductor device disposed between the redistribution layer and the first semiconductor device, wherein the molded structure encapsulates the first semiconductor device and the second semiconductor device, and an active surface of the second semiconductor device faces towards the redistribution layer.

10. The semiconductor package of claim 9, wherein a surface of the first semiconductor device is substantially coplanar with the upper surface of the first conductive connector and the upper surface of the second conductive connector.

11. The semiconductor package of claim 8, wherein:
an upper surface of the molded structure includes a central portion and a peripheral portion extending around the central portion; and
the peripheral portion has a thickness that is less than a thickness of the central portion.

12. The semiconductor package of claim 11, wherein the upper surface of the second conductive connector is substantially coplanar with a substantially horizontal surface of the peripheral portion.

13. The semiconductor package of claim 8, further comprising a semiconductor device encapsulated by the molded structure, wherein the semiconductor device has an active surface that faces towards the redistribution layer and is substantially coplanar with a lower surface of the first conductive connector.

14. A semiconductor package, comprising:
a redistribution layer;
a semiconductor device having an active surface facing towards and electrically connected to the redistribution layer;
a plurality of connecting elements circumscribing the semiconductor device and disposed adjacent to the redistribution layer, the plurality of connecting elements including:
a first connecting element; and
a second connecting element that is disposed between the first connecting element and the semiconductor device; and
a package body encapsulating the semiconductor device and the second connecting element;
wherein the first connecting element has an upper surface that is exposed from the package body, and the active surface of the semiconductor device is substantially coplanar with a lower surface of the first connecting element and a lower surface of the second connecting element.

15. The semiconductor package of claim 14, wherein an upper surface of the second connecting element is recessed below an upper surface of the package body.

16. The semiconductor package of claim 14, wherein:
the package body has an upper surface that includes a central portion and a peripheral portion extending around the central portion; and
the peripheral portion has a thickness that is less than a thickness of the central portion.

17. The semiconductor package of claim 16, wherein the upper surface of the first connecting element is exposed from the peripheral portion.

18. The semiconductor package of claim 16, wherein an upper surface of the second connecting element is substantially coplanar with a substantially horizontal surface of the peripheral portion.

19. The semiconductor package of claim 14, wherein an upper surface of the second connecting element is substantially coplanar with the upper surface of the first connecting element.

20. The semiconductor package of claim 14, wherein the semiconductor device is a first semiconductor device, and further comprising a second semiconductor device disposed between an upper surface of the package body and the first semiconductor device.

* * * * *